United States Patent [19]

Malaviya

[11] 4,319,148
[45] Mar. 9, 1982

[54] HIGH SPEED 3-WAY EXCLUSIVE OR LOGIC CIRCUIT

[75] Inventor: Shashi D. Malaviya, Fishkill, N.Y.

[73] Assignee: International Business Machines Corp., Armonk, N.Y.

[21] Appl. No.: 107,810

[22] Filed: Dec. 28, 1979

[51] Int. Cl.³ .................... H03K 19/21; H03K 19/013
[52] U.S. Cl. ................................. 307/471; 307/455; 307/458; 307/470
[58] Field of Search .............. 307/455, 457, 458, 464, 307/466, 467, 470, 471, 472; 364/784

[56] References Cited

U.S. PATENT DOCUMENTS

| | | | |
|---|---|---|---|
| 2,850,647 | 9/1958 | Fleisher | 307/471 |
| 2,926,850 | 3/1960 | Richards | 235/175 |
| 2,927,733 | 3/1960 | Campbell, Jr. | 235/176 |
| 3,016,466 | 1/1962 | Richards | 307/471 X |
| 3,628,000 | 12/1971 | Weiss | 307/471 X |
| 3,649,844 | 3/1972 | Kroos | 307/471 |
| 4,041,326 | 8/1977 | Robinson | 307/471 |
| 4,133,040 | 1/1979 | Hampel | 307/471 X |

FOREIGN PATENT DOCUMENTS 2629270  1/1978  Fed. Rep. of Germany ...... 307/471
2727139 12/1978  Fed. Rep. of Germany ...... 307/471

OTHER PUBLICATIONS

Gersbach, "Four-Way Exclusive-OR", *IBM Tech. Discl. Bull.*, vol. 11, No. 9, pp. 1162–1163; 2/69.
Gersbach, "Cascade Exclusive OR", *IBM Tech. Discl. Bull.*, vol. 19, No. 6, pp. 2010–2011; 11/76.
Lohrey et al. "Gated Exclusive or Circuit", *IBM Tech. Discl. Bull.*, vol. 19, No. 6; pp. 2080; 11/76.
Evans, "Exclusive-OR Complement Circuit", *IBM Tech. Discl. Bull.*, vol. 9, No. 9, pp. 1210–1211; 2/67.

*Primary Examiner*—Larry N. Anagnos
*Attorney, Agent, or Firm*—Edward W. Brown

[57] ABSTRACT

A 3-way Exclusive OR function is performed in an essentially single stage logic delay. A 3-way OR circuit produces a logical "1" output whenever at least one of three input operands is "1". A Two And Only Two logic circuit produces a logical "0" output when two and only two of the three input operands are "1". The outputs of the OR circuit and the Two And Only Two logic circuits are DOT-ANDed to provide a desired Exclusive OR function. In one form of the invention, the Two And Only Two logic circuit comprises three Schottky diode transistor NAND circuits each having two normal inputs and one inhibit input with the inhibit input of each of the three NAND circuits being connected to receive a different one of the three input operands while the two normal inputs being connected to receive the remaining ones of the three input operands. The OR circuit comprises four transistors having their emitters coupled to a common current source. The base of one of the four transistors is connected to a reference potential while the bases of the other three transistors are connected to receive respective one of the three input operands. Outputs of the three NAND circuits and the output of the 3-way OR circuit are DOT-ANDed at an input of an emitter follower output stage.

13 Claims, 5 Drawing Figures

HIGH SPEED 3-WAY EXCLUSIVE OR LOGIC CIRCUIT

BACKGROUND OF THE INVENTION

1. Field of the Invention

The present invention relates to a high speed Exclusive OR logic circuit, and more particularly to a high speed 3-way Exclusive OR logic circuit with essentially a single stage logic delay.

2. Description of the Prior Art

U.S. Pat. No. 2,926,850 to R. K. Richards, issued Mar. 1, 1960 and assigned to the assignee of the present application, shows a 3-way Exclusive OR circuit as a summer portion (23-28, 32-34 of FIG. 2 of the patent) of a binary adder/subtractor. The Exclusive OR circuit disclosed comprises a combination of diode AND circuits, diode OR circuits and inverter circuits. A 3-way OR circuit is provided to produce a "1" output whenever one or more input operands are "1". Three 2-way AND circuits, an OR-Inverter and a 2-way AND circuit are used to inhibit "1" output of the 3-way OR circuit whenever two or more input operands are "1". A 3-way AND circuit is provided to produce "1" output when all of the three input operands are "1". The outputs of the 3-way OR circuit and the 3-way AND circuit are ORed to provide final Exclusive OR function. Because of series combination of several logic elements, the 3-way Exclusive OR circuit disclosed includes three-stage logic delay. In addition, it needs relatively large numbers of logic elements.

U.S. Pat. No. 2,850,647 to H. Fleisher, issued Sept. 2, 1958 and assigned to the assignee of the present application, shows a 2-way Exclusive OR circuit. A block diagram of FIG. 5 of the patent shows that an output from a 2-way OR circuit and an output from a 2-way AND circuit are combined in an Inhibit circuit (AND plus INV) to obtain 2-way Exclusive OR function. Although this patent uses the output of the 2-way AND circuit to inhibit the output of the 2-way OR circuit when both input operands are "1", it does not teach any specific manner to perform 3-way Exclusive OR function with essentially a single stage logic delay.

U.S. Pat. No. 3,649,844 to F. K. Kroos, issued Mar. 14, 1972 and assigned to Siemens AG, shows a 3-way Exclusive OR circuit. It uses four current switches constructed in accordance with two-level current switch tree configuration. Because of this configuration, the 3-way Exclusive OR circuit disclosed requires a level shifter for one of the input operands, and a higher voltage supply than is usually required for one-level current switch circuit.

U.S. Pat. No. 4,041,326 to B. J. Robinson, issued Aug. 9, 1977 and assigned to FCI Corp., shows a 3-way Exclusive OR circuit implemented by current switches. This circuit, however, requires both true and complement input operands for each of the three input operands. This means that one-stage logic delay is additionally included to produce complement forms of input operands. In addition, the circuit disclosed uses a three-level current switch tree which requires higher voltage supply and two levels of logic level shifters.

U.S. Pat. No. 2,927,733 to C. M. Campbell, Jr., issued Mar. 8, 1960 and assigned to Burroughs Corp., shows a 3-way Exclusive OR which comprises a combination of NPN transistor current switches and PNP transistor current switches. Since the PNP transistor current switches are included, the operation speed of the circuit is slow because the PNP transistor circuit is normally two to three times as slow as the NPN circuit. In addition, time-consuming and complicated process is needed to construct the PNP-NPN transistor circuit on a single chip.

IBM Technical Disclosure Bulletin by J. E. Gersbach, entitled "FOUR-WAY EXCLUSIVE-OR", Vol. 11, No. 9, February 1969, pages 1162–1163 shows a 4-way Exclusive OR circuit which uses a two-level current switch tree. In addition, this circuit requires true form of input operands for two operands and complement form of input operands for two other operands.

IBM Technical Disclosure Bulletin by J. E. Gersbach entitled "CASCODE EXCLUSIVE OR", Vol. 19, No. 6, November 1976, pages 2010–2011, shows a 5-way Exclusive OR circuit implemented by a five-level cascode current switch tree which requires a high voltage supply and several level shifters.

IBM Technical Disclosure Bulletin by F. H. Lohrey et al entitled "GATED EXCLUSIVE OR CIRCUIT", Vol. 19, No. 6, November 1976, page 2080, shows an Exclusive OR circuit which performs a logical function of $(A \cdot B \cdot C \cdot D) \forall (E \cdot F \cdot G \cdot H)$. It shows a circuit structure constructed in accordance with a Schottky diode-transistor logic to perform the above logic function.

None of the prior art teaches a 3-way Exclusive OR logic circuit which includes essentially single stage logic delay, does not require a multi-level current switch tree and hence does not require a high voltage supply, and does not require both true and complement input operands.

SUMMARY OF THE INVENTION

It is an object of the present invention to provide a high speed 3-way Exclusive OR circuit with essentially a single stage logic delay.

It is another object of the present invention to provide a high speed 3-way Exclusive OR circuit which operates with a low voltage supply.

It is another object of the present invention to provide a high speed 3-way Exclusive OR circuit which can be readily implemented on an IC chip.

It is a further object of the present invention to provide a high speed 3-way Exclusive OR circuit which can be implemented using commonly available semiconductor circuits and processes.

In accordance with the present invention, a 3-way OR circuit is provided to produce a "1" output whenever one or more of three input operands are "1". A TWO AND ONLY TWO logic circuit is provided to detect when two and only two of three input operands are "1". Output of this TWO AND ONLY TWO logic circuit is used to inhibit the "1" output of the 3-way OR circuit when two and only two of the input operands are "1". As a result, the inhibit circuit produces "1" output only when one or three of the input operands are "1", which is a desired Exclusive OR function.

One of the significant features of the present invention is that an entire circuit is constructed in such a manner that only a single stage logic delay is included from a circuit input to a circuit output.

In one preferred form of the invention, the TWO AND ONLY TWO logic circuit is implemented by three Schottky diode-transistor logic circuits, which are high speed in nature, while in another preferred form of the invention it is implemented by three current switch circuits, which are also high speed in nature. Since no multi-level cascode tree of the current switches is included, the circuit operates with a low voltage power supply.

DETAILED DESCRIPTION OF THE PREFERRED EMBODIMENTS

As is old in the art, a 3-way Exclusive OR circuit performs a logical function of $A \forall B \forall C = A \cdot \overline{B} \cdot \overline{C} + \overline{A} \cdot B \cdot \overline{C} + \overline{A} \cdot \overline{B} \cdot C + A \cdot B \cdot C$, where A, B and C are input operands in true form and $\overline{A}$, $\overline{B}$ and $\overline{C}$ are input operands in complement form. The above Exclusive OR function may be illustrated using binary notations.

TABLE 1

| Combination | A | B | C | OUT |
|---|---|---|---|---|
| 1 | 0 | 0 | 0 | 0 |
| 2 | 1 | 0 | 0 | 1 |
| 3 | 0 | 1 | 0 | 1 |
| 4 | 0 | 0 | 1 | 1 |
| 5 | 1 | 1 | 0 | 0 |
| 6 | 0 | 1 | 1 | 0 |
| 7 | 1 | 0 | 1 | 0 |
| 8 | 1 | 1 | 1 | 1 |

There are eight different combinations of three input operands A, B and C. In a proper Exclusive OR operation, only the combinations 2, 3, 4 and 8 should produce "1" outputs. The principle of the present invention is ORing the three input operands to produce "1" outputs for any of the combinations 2 through 8 and inhibiting those "1" outputs only when two and only two input operands are "1", that is, only for the combinations 5, 6 and 7.

Figure 1:
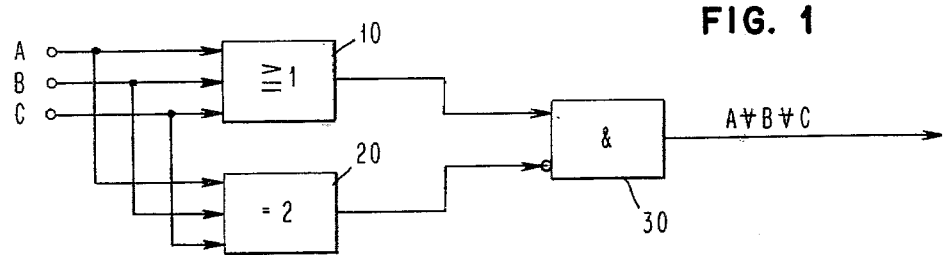
FIG. 1 shows a block diagram of a 3-way Exclusive OR circuit constructed in accordance with a principle of the present invention.

Referring to FIG. 1, the above principle of operation is implemented by a combination of a 3-way OR circuit 10, a TWO AND ONLY TWO logic circuit 20 and a 2-way AND circuit 30. The OR circuit 10 produces "1" outputs for the input operand combinations 2, 3, 4, 5, 6, 7 and 8 of the Table 1 above. The TWO AND ONLY TWO "1"'s circuit produces "1" output for the combinations 5, 6 and 7. By applying the output of the OR circuit 10 to one input of the AND circuit 30 while applying the output of the TWO AND ONLY TWO logic circuit 20 to an inhibit input of the AND circuit 30, the "1" outputs from the OR circuits 10 are inhibited only when two of the input operands A, B and C are "1", that is, for the combinations 5, 6 and 7. As a result, final outputs from the AND circuit 30 represent the Exclusive OR function of the three input operands A, B and C.

Figure 2:
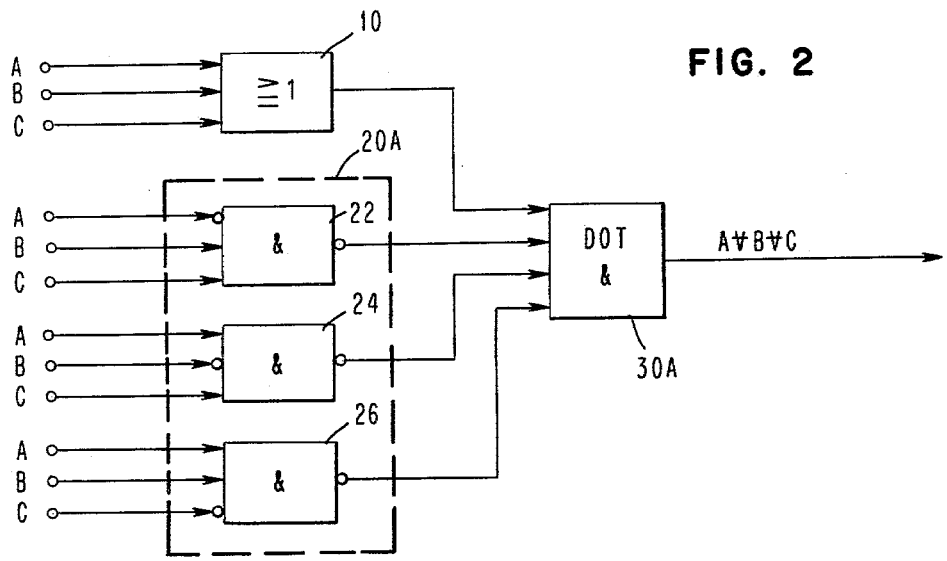
FIG. 2 shows a detailed block diagram of the 3-way Exclusive OR circuit shown in FIG. 1.

FIG. 2 shows a detailed block diagram of the circuit of FIG. 1. In FIG. 2, the TWO AND ONLY TWO logic circuit 20 of FIG. 1 has been replaced by a circuit 20A which comprises three 3-way NAND circuits 22, 24 and 26 each having one inhibit input connected to a different one of the three input operands A, B and C. The outputs of the NAND circuits 22, 24 and 26 and the output from the OR circuit 10 are DOT-ANDed at a DOT-AND circuit 30A. The combination of the circuits 20A and 30A is functionally equivalent to the combination of the circuits 20 and 30 in FIG. 1. The operation of the circuit of FIG. 2 is outlined below. The NAND circuit 22 receives the operand A at the inhibit input terminal and receives the operands B and C at normal input terminals. Thus, the NAND circuit 22 produces "0" output only when (A, B, C)=(0, 1, 1) which corresponds to the combination 6 in Table 1. Similarly, the NAND circuits 24 and 26 produce "0" outputs only when (A, B, C)=(1, 0, 1) (corresponding to the combination 7 in Table 1) and (A, B, C)=(1, 1, 0) (corresponding to the combination 5 in Table 1), respectively. Those three "0" outputs from the NAND circuits 22, 24 and 26 together with the DOT-AND circuit 30A are effective to inhibit the "1" outputs from the OR circuit 10 so that the DOT-AND circuit 30A produces "1" output only for the combinations 2, 3, 4 and 8.

A novel and important aspect of the present invention resides in a specific manner in which each of the logic blocks shown in FIG. 2 is implemented by a semiconductor circuit such that total circuit delay does not exceed one stage logic delay.

Figure 3:
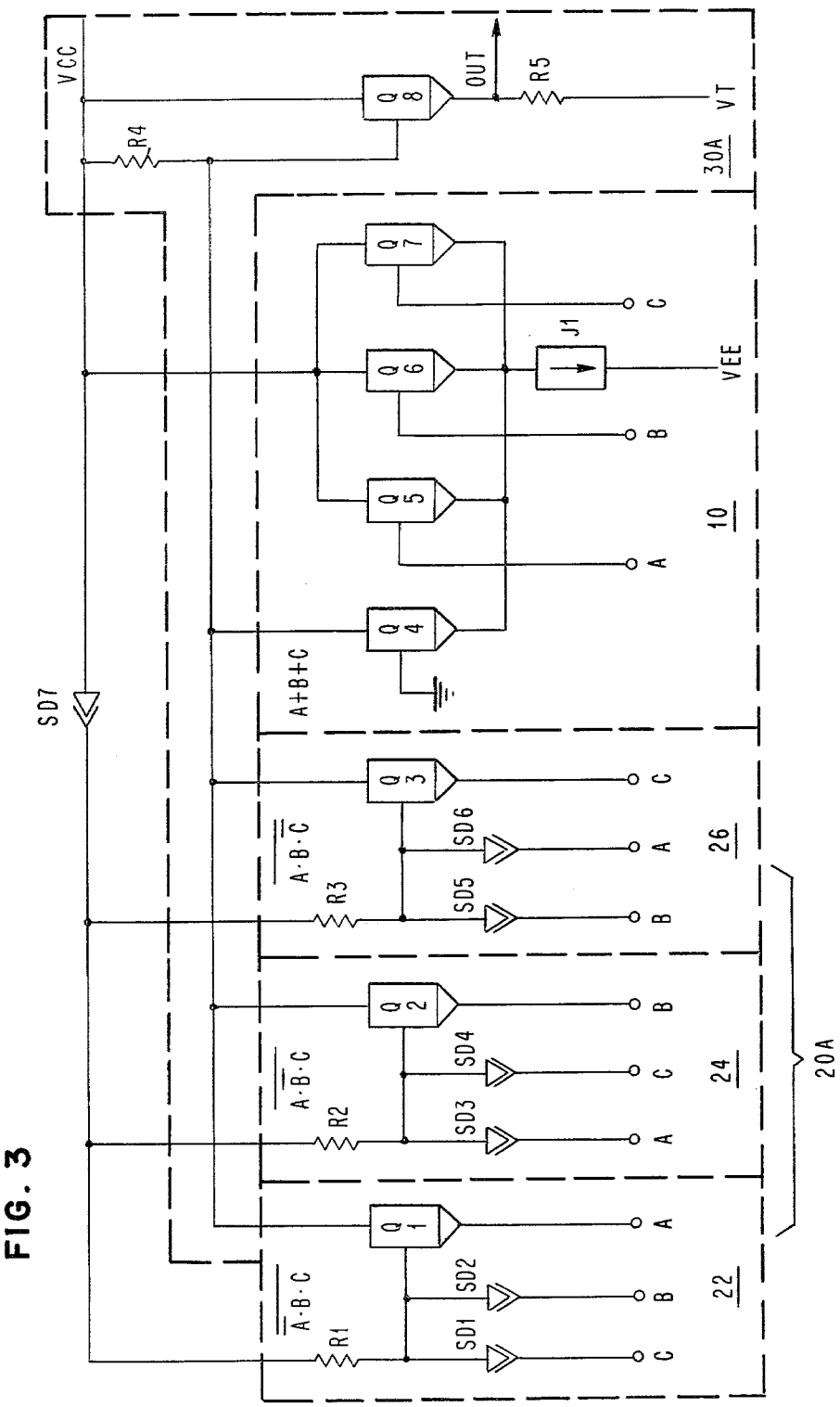
FIG. 3 shows a circuit diagram of one preferred embodiment of the 3-way Exclusive OR circuit of the present invention.

Referring to FIG. 3, there is shown one preferred embodiment of the present invention in accordance with the principle of operation described with reference to FIGS. 1 and 2. The same reference numerals as those in FIGS. 1 and 2 are used to indicate the like logic block. The OR circuit 10 comprises four transistors Q4, Q5, Q6 and Q7 having their emitters commonly connected to a constant current source J1. The base of the transistor Q4 is connected to a reference potential which is ground potential in the illustrated embodiment, while bases of the transistors Q5, Q6 and Q7 are connected to operand input terminals A, B and C, respectively. Collectors of the transistor Q5, Q6 and Q7 are connected in common to a voltage source Vcc while the collector of the transistor Q4 is connected to a load resistor R4, the other end of which is connected to the voltage source Vcc. Thus, the transistors Q4–Q7 function as a well-known OR circuit such that whenever one or more of the three input operands A, B and C are UP or "1" the transistor Q4 is nonconductive and the collector potential of the transistor Q4 is UP or "1". This UP or "1" signal at the collector of Q4 is conveyed to a base of an emitter follower transistor Q8 which acts as the AND circuit 30 shown in FIG. 2, as will be explained hereinafter.

The NAND circuits 22, 24 and 26 shown in FIG. 2 are implemented in the illustrated embodiment by diode-transistor logic, preferably Schottky diode-transistor logic. The NAND circuit 22 comprises a transistor Q1, two Schottky diodes SD1 and SD2 and a resistor R1, the NAND circuit 24 comprises a transistor Q2, two Schottky diodes SD3 and SD4 and a resistor R2, and the NAND circuit 26 comprises a transistor Q3, two Schottky diodes SD5 and SD6 and a resistor R3. For the NAND circuit 22, the emitter of the transistor Q1 is connected to the operand A input terminal and cathodes of the diodes SD1 and SD2 are connected to operand C and B input terminals. Anodes of the diodes SD1 and SD2 are connected in common to the base of the transistor Q1 and to one terminal of the resistor R1, the other terminal of which is connected to a voltage source. The NAND circuits 24 and 26 are constructed similarly except that the connections to the operand input terminals are different. Collectors of the three transistors Q1, Q2 and Q3 are connected in common with the collector of the transistor Q4 to provide a DOT-AND function. A Schottky diode SD7 is used to limit the UP level of the bases of the transistors Q1–Q3. A separate locally generated bias source may be used instead.

The operation of the circuit of FIG. 3 is now explained. As described before, the circuit 10 is a conventional current switch OR circuit. Assuming that the NAND circuits 22, 24 and 26 were not provided, an UP level or "1" output is produced at the emitter of the transistor Q8 whenever one, two or all of the three input operands A, B and C are UP or "1". The function of the circuits 22, 24 and 26 is to inhibit the "1" output from appearing at the emitter of Q8 if and only if two of the three input operands A, B and C are UP or "1". The NAND circuit 22 produces DOWN or "0" output at the collector of the transistor Q1 if and only if (A, B, C)=(DOWN, UP, UP) or (0, 1, 1). That is, the transistor Q1 conducts only when A is DOWN and B and C are UP. In other cases, for example, when A and C are DOWN and B is UP, Q1 does not conduct because the diode SD1 draws current to drop the base potential of the transistor Q1. Thus, circuit 22 performs a logical function of $\overline{A} \cdot B \cdot C$. Similarly, the circuits 24 produces DOWN or "0" output if and only if (A, B, C)=(1, 1, 0). In other words, the circuits 24 and 26 perform logical functions of $A \cdot \overline{B} \cdot C$ and $A \cdot B \cdot \overline{C}$, respectively.

The $\overline{A} \cdot B \cdot C$, $A \cdot \overline{B} \cdot C$ and $A \cdot B \cdot \overline{C}$ outputs from the circuits 22, 24 and 26, respectively, and the (A+B+C) output from the circuit 10 are DOT-ANDed at the input of the circuit 30 so that the output from the circuit 30 represents $A \cdot \overline{B} \cdot \overline{C} + \overline{A} \cdot B \cdot \overline{C} + \overline{A} \cdot \overline{B} \cdot C + A \cdot B \rightleftarrows C$.

It should be noted that the circuit of FIG. 3 is constructed by Schottky diode-transistor logic circuits, a current switch circuit and an emitter follower circuit, all of which are high speed in nature. Since the inhibit action of the output for two "1"'s happens in parallel or simultaneously rather than sequentially, the delay included is only single stage logic delay. That is, the combination of circuits 22, 24, 26 and 30A includes one stage logic delay and the combination of circuits 10 and 30A includes one stage logic delay. Since those combinations function in parallel, the total delay included is one stage logic delay. It should also be noted that only one form of input operands A, B, C is required to perform the 3-way Exclusive OR. This is a great advantage because additional logic delay would be involved if the circuit would require both true and complement forms of input operands. In addition, since the illustrated circuit includes no multi-level current circuit tree, it operates with a low voltage supply. By way of non-limiting example, the circuit operates satisfactorily with Vcc= +1.4 volts, Vee= −2.2 volts and Vt= −0.7 volts.

Figure 4:
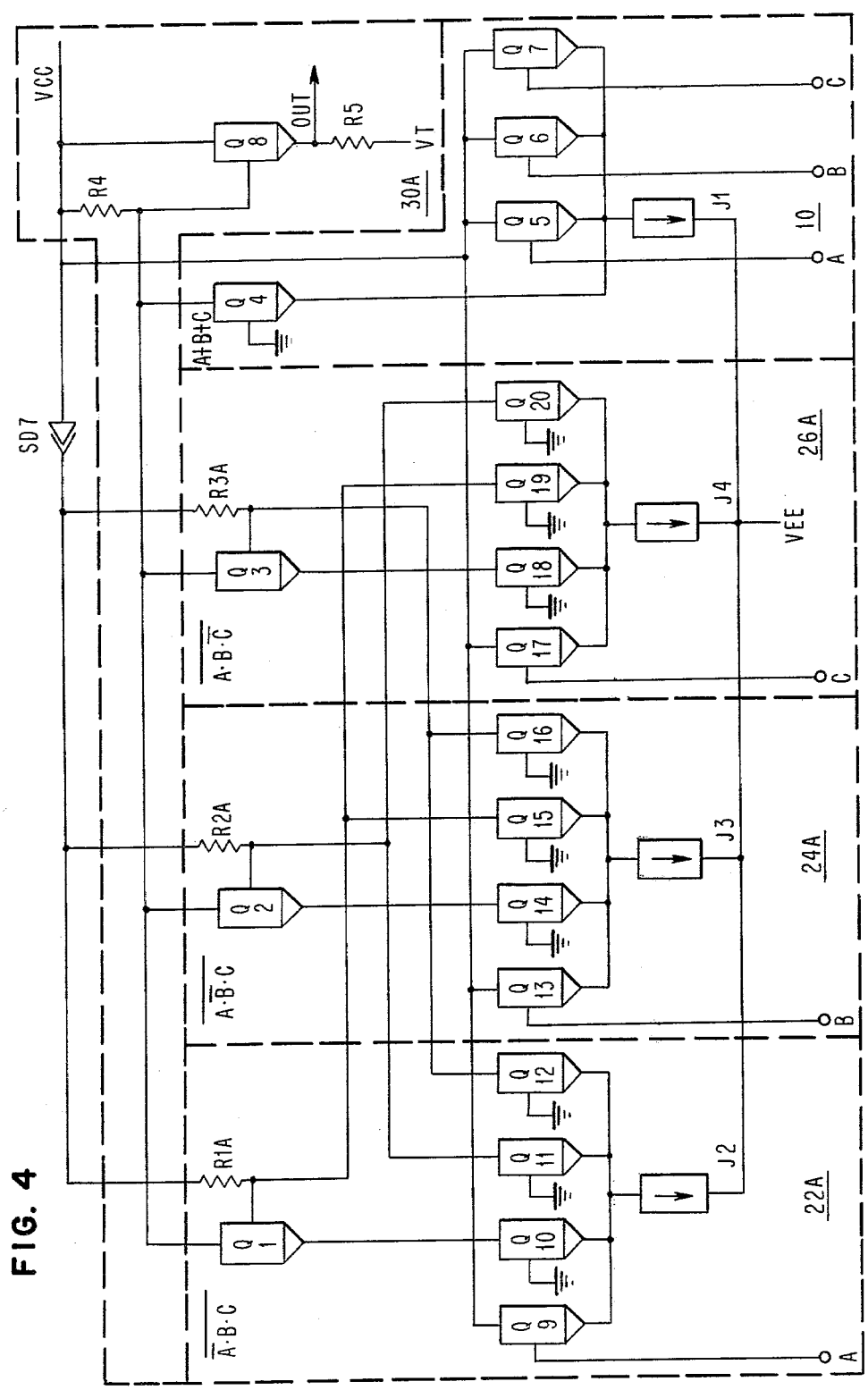
FIG. 4 shows a circuit diagram of another preferred embodiment of the 3-way Exclusive OR circuit of the present invention.

FIG. 4 shows another preferred embodiment of the present invention. In FIG. 4, the same symbols and reference numerals as those in FIG. 3 are used to represent the same or like elements. In the embodiment of FIG. 4, the Schottky diodes have now been eliminated by the introduction of three current switches as shown. More specifically, a NAND circuit 22A comprises transistors Q1, Q9, Q10, Q11 and Q12, a resistor R1A and a current source J2. The transistors Q9 to Q12 are connected to form a current switch with the base of Q9 being connected to the operand A input terminal and bases of Q10 to Q12 being connected to a reference potential, ground potential in the illustrated embodiment. The collector of the transistor Q9 is connected to the voltage source Vcc, the collector of the transistor Q10 is connected in series with the transistor Q1, the collector of the transistor Q11 is connected to the base of the transistor Q2, and the collector of the transistor Q12 is connected to the base of the transistor Q3. The base of the transistor Q1 is connected to one terminal of the resistor R1A and the collector of the transistor Q1 is connected in common with the collectors of the transistors Q2, Q3 and Q4 as is the case of FIG. 3. The NAND circuits 24A and 26A which include transistors Q2, Q13 to Q16 and Q3, Q17 to Q20, respectively, are constructed in the same manner as the NAND circuit 22A except that they receive different input operands. The OR circuit 10 and the DOT-AND circuit 30A are identical to those of FIG. 3 and hence no additional explanation will be required.

The circuit of FIG. 4 operates under the same operation principle as that of FIG. 3. Again, the circuits 22A, 24A and 26A function to inhibit the "1" outputs from the OR circuit 10 from appearing at the output of the circuit 30 when two and only two operands are "1". Now, assuming that (A, B, C)=(0, 1, 1), the current switch transistors Q10, Q11, Q12, Q13, Q17 are ON and Q9, Q14, Q15, Q16, Q18, Q19 Q20 are OFF. Since Q14 and Q18 are OFF, the transistors Q2 and Q3 do not draw current. The base of the transistor Q1 is sufficiently high because the transistors Q15 and Q19 are OFF. As a result, the transistor Q1 draws a current resulting in a DOWN level at the collector thereof. Similarly, when (A, B, C)=(1, 0, 1) or (1, 1, 0) the transistors Q2 or Q3, respectively, draws a current. On the other hand, if none, only one or all of the three input operands are "1⇌", none of the transistors Q1, Q2 and Q3 draws current. For example, if (A, B, C)=(0, 0, 1), the transistors Q9 and Q13 are OFF and the transistor Q17 is ON. Since the transistor Q15 is ON at this time, the potential at the base of the transistor Q1 is not high enough to render the transistor Q1 to draw sufficient current. Similarly, the potential at the base of the transistor Q2 is not high enough to render the transistor Q2 to draw sufficient current because the transistor Q11 is ON. The Transistor Q3 does not draw a current because the transistor Q18 is OFF. Thus, none of the transistors Q1, Q2 and Q3 draws sufficient current and the potential at the collectors of Q1, Q2 and Q3 remains at UP level. If (A, B, C)=(1, 1, 1), the transistors Q10, Q14 and Q18 are OFF and hence none of the transistors Q1, Q2 and Q3 can draw current. If (A, B, C)=(0, 0, 0), the transistors Q9, Q13 and Q17 are OFF and the transistors Q10–Q12, Q14–Q16, Q18–Q20 are ON. However, the transistor Q1 does not draw sufficient current because the potential at the base of Q1 is low since the transistors Q15 and Q19 are ON. Similarly, the transistors Q2 and Q3 do not draw sufficient current because their base potentials are low. In this case, however, the transistor Q4 of the OR circuit 10 is ON resulting in DOWN level at the junction of the collectors of the transistors Q1–Q4.

While the circuits of FIGS. 3 and 4 have been specifically shown and described using the NPN transistors, it should be understood that PNP transistors can be equally used with appropriate change of polarities of various voltage sources and diodes. In the PNP transistor versions, however, a negative logic rather than a positive logic is used.

Although not specifically shown in FIG. 4 for clarity, load resistors can obviously be connected from Vcc to the collectors of transistors Q10-Q12, Q14-Q16 and Q18-Q20. Furthermore, antisaturation clamps can also be used across the base-collector junctions of these transistors (Q10-Q12, Q14-Q16 and Q18-Q20) to prevent delays due to saturation. Alternately, the anodes of such clamps can be connected to external dc bias sources, instead of to the bases of the transistors. Since these antisaturation and speed enhancement techniques are well known, no further explanation is necessary here.

Figure 5:
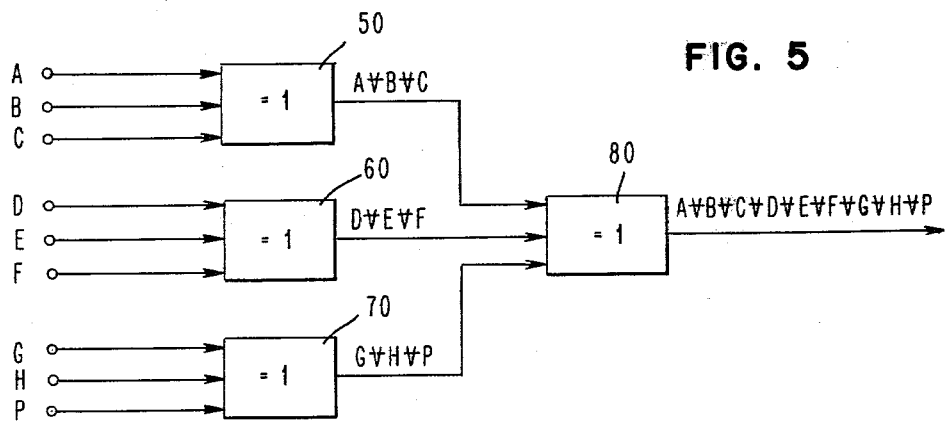
FIG. 5 shows a block diagram of a 9-way Exclusive OR circuit.

FIG. 5 shows in block form how the 3-way Exclusive OR circuits 50, 60, 70 and 80 of the present invention are assembled to form a 9-way Exclusive OR circuit. By using the 3-way Exclusive OR circuits of the present invention, a total delay included in the 9-way Exclusive OR is only two-stage logic delay. Such a 9-way Exclusive OR circuit may be advantageously used to generate an odd parity for 9-bit block.

While the invention has been described with reference to a preferred embodiment thereof, it will be understood by those skilled in the art that the above and other changes may be made therein without departing from the spirit and scope of the invention.

Having thus described my invention, what I claim as new, and desire to secure by Letters Patent is:

1. A 3-way Exclusive OR logic circuit having an essentially single stage logic delay comprising:
   a 3-way OR logic circuit for providing a logical "1" output signal when one or more of three inputs thereof receive a logical "1" operand signal;
   a 3-way Two And Only Two logic circuit for providing a logical "0" output signal when two and only two of three inputs thereof receive logical "1" operand signals and providing logical "1" output signals in all other cases;
   the three inputs of said 3-way OR logic circuit and the three inputs of said 3-way Two And Only Two logic circuit receiving the same corresponding logical operand signals, respectively;
   a DOT-AND logical connecting means for DOT-ANDing the outputs of said 3-way OR logic circuit and said 3-way Two And Only Two logic circuit, whereby providing a logical "1" output signal when either one or all of said three inputs of said 3-way OR logic circuits and said 3-way Two And Only Two logic circuit receive logical "1" operand signal.

2. A 3-way Exclusive OR circuit according to claim 1 wherein:
   said 3-way Two And Only Two logic circuit comprises first, second and third 3-way NAND circuits each having one inhibit input;
   said inhibit inputs of said first, second and third NAND circuits being connected to receive first, second and third ones of the three logical operands, respectively, the other two inputs of said first, second and third NAND circuits each being connected to receive the remaining two of the three logical operands;
   the outputs of said first, second and third NAND circuits and the output of said 3-way OR logic circuit being DOT-ANDed by said DOT-AND logical connecting means.

3. A 3-way Exclusive OR circuit according to claim 2 wherein:
   said first, second and third NAND circuits each has one inhibit input and two normal inputs;
   said first NAND circuit having its inhibit input connected to receive a first one of the three operand signals and having its normal inputs connected to receive second and third ones of the three operand signals;
   said second NAND circuit having its inhibit input connected to receive said second one of the three operand signals and having its normal inputs connected to receive said first and third ones of the three operand signals; and
   said third NAND circuit having its inhibit input connected to receive said third one of the three operand signals and having its normal inputs connected to receive said first and second operand signals.

4. A 3-way Exclusive OR logic circuit according to claim 3 wherein:
   said first, second and third NAND circuits each comprising: an NPN transistor, a pair of diodes with their anodes connected in common to a base of said NPN transistor, and a resistor having one terminal thereof connected to the junction of said anodes of said pair of diodes and the base of said NPN transistor and having the other terminal thereof connected to a voltage source;
   emitters of the first, second and third NPN transistors of said first, second and third NAND circuits being connected to receive the first, second and third ones of the three operand signals, respectively, while cathodes of said pairs of diodes of said first, second and third NAND circuits being connected to receive the remaining two of the three operand signals, respectively;
   collectors of said first, second and third NPN transistors being connected to a common load resistor;
   said first, second and third NPN transistors each being biased such that it conducts only when the input at the emitter thereof receives a down level operand signal indicative of logical "0" and both inputs at the cathodes of the pair of diodes receive up level operand signals indicative of logical "1".

5. A 3-way Exclusive OR circuit according to claim 4 wherein said pairs of diodes of said first, second and third NAND circuits are Schottky diodes.

6. A 3-way Exclusive OR circuit according to claim 4 or 5 wherein:
   said 3-way OR circuit comprises fourth, fifth, sixth and seventh NPN transistors having their emitters connected to a common current source, the base of said fourth NPN transistor being connected to a reference potential source, bases of said fifth, sixth and seventh NPN transistors being connected to receive said first, second and third ones of the three operand signals, respectively, collectors of said fifth, sixth and seventh NPN transistors being connected in common to a voltage source, the collector of said fourth NPN transistor being connected in common with the collectors of said first, second and third NPN transistors;
   said fourth, fifth, sixth and seventh NPN transistors each being biased such that said fourth NPN transistor does not conduct when one or more of the inputs at the bases of said fifth, sixth and seventh NPN transistors receives an up level operand signal indicative of logical "1" and said fourth NPN transistor conducts only when all of the three inputs at the bases of said fifth, sixth and seventh NPN transistors receive down level operand signals indicative of logical "0".

7. A 3-way Exclusive OR circuit according to claim 6 further comprising:
an eighth NPN transistor connected in an emitter follower configuration;
the base of said eighth NPN transistor being connected to the junction of the collectors of said first, second, third and fourth NPN transistors and said load resistor, whereby said eighth NPN transistor produces an output signal indicative of logical level appearing at the collectors of said first, second, third and fourth NPN transistors.

8. A 3-way Exclusive OR logic circuit according to claim 3 wherein:
said first, second and third NAND circuits each comprising: a PNP transistor, a pair of diodes with their cathodes connected in common to a base of said PNP transistor, and a resistor having one terminal thereof connected to the junction of said cathodes of said pair of diodes and the base of said PNP transistor and having the other terminal thereof connected to a voltage source;
emitters of the first, second and third PNP transistors of said first, second and third NAND circuits being connected to receive the first, second and third ones of the three operand signals, respectively, while anodes of said pairs of diodes of said first, second and third NAND circuits being connected to receive the remaining two of the three operand signals, respectively;
collectors of said first, second and third PNP transistors being connected to a common load resistor;
said first, second and third PNP transistors each being biased such that it conducts only when the input at the emitter thereof receives an up level operand signal indicative of logical "0" and both inputs at the anodes of the pair of diodes receive down level operand signals indicative of logical "1".

9. A 3-way Exclusive OR circuit according to claim 8 wherein said pairs of diodes of said first, second and third NAND circuits are Schottky diodes.

10. A 3-way Exclusive OR circuit according to claim 8 or 9 wherein:
said 3-way OR circuit comprises fourth, fifth, sixth and seventh PNP transistors having their emitters connected to a common current source, a base of said fourth PNP transistor being connected to a reference potential source, bases of said fifth, sixth and seventh PNP transistors being connected to receive said first, second and third ones of the three operand signals, respectively, collectors of said fifth, sixth and seventh PNP transistors being connected in common to a voltage source, the collector of said fourth PNP transistor being connected in common with the collectors of said first, second and third PNP transistors;
said fourth, fifth, sixth and seventh PNP transistors each being biased such that said fourth PNP transistor does not conduct when one or more of the inputs at the bases of said fifth, sixth and seventh PNP transistors receives a down level operand signal indicative of logical "1" and said fourth NPN transistor conducts only when all of the three inputs at the bases of said fifth, sixth and seventh PNP transistors receive up level operand signals indicative of logical "0".

11. A 3-way Exclusive OR circuit according to claim 10 further comprising:
an eighth PNP transistor connected in an emitter follower configuration;
a base of said eighth PNP transistor being connected to the junction of the collectors of said first, second, third and fourth PNP transistors and said load resistor, whereby said eighth PNP transistor produces an output signal indicative of logical level appearing at the collectors of said first, second, third and fourth PNP transistors.

12. A 3-way Exclusive Or logic circuit according to claim 2 wherein:
said first, second and third NAND circuits each includes first, second, third, fourth and fifth transistors of the same conductivity type, said second, third, fourth and fifth transistors having their emitters connected in common to a current source, bases of said third, fourth and fifth transistors being connected to a reference potential, the collector of said third transistor being connected to the emitter of said first transistor, the base of said first transistor being connected to a voltage source via a resistor, the collector of said second transistor being connected to a voltage source;
bases of said second transistors of said first, second and third NAND circuits being connected to receive a first, second and third ones of the three logical operand signals, respectively;
the bases of said first transistors of said first, second and third NAND circuits being connected to collectors of either said fourth or said fifth transistors, of said second and third NAND circuits, said first and third NAND circuits and said first and second NAND circuits, respectively;
collectors of said first transistors of said first, second and third NAND circuits and the output of said 3-way OR logic circuit being DOT-ANDed by said DOT-AND logical connecting means.

13. A 3-way Exclusive OR logic circuit according to claim 12 wherein:
said 3-way OR logic circuit is a current switch type 3-way OR logic circuit constructed by four transistors of the same conductivity type as that of said transistors of said first, second and third NAND circuits;
the collector of the output transistor of said current switch type 3-way OR logic circuit being DOT-ANDed with said collectors of said first transistors of said first, second and third NAND circuits.

* * * * *